United States Patent
Kirisawa

[19]

[11] Patent Number: 6,144,259

[45] Date of Patent: Nov. 7, 2000

[54] LOW-NOISE AMPLIFIER AND CIRCUIT FOR CONTROLLING THE SAME

[75] Inventor: Akihiro Kirisawa, Tokyo, Japan

[73] Assignee: NEC Corporation, Tokyo, Japan

[21] Appl. No.: 09/271,530

[22] Filed: Mar. 18, 1999

[30] Foreign Application Priority Data

Mar. 18, 1998 [JP] Japan .................................. 10-067535

[51] Int. Cl.[7] ...................................................... H03F 3/04
[52] U.S. Cl. ............................ 330/296; 330/298; 455/78
[58] Field of Search .................................. 330/277, 296, 330/298, 302; 455/78, 84, 83, 573, 575

[56] References Cited

U.S. PATENT DOCUMENTS

| | | | |
|---|---|---|---|
| 4,637,073 | 1/1987 | Selin et al. . | |
| 4,656,653 | 4/1987 | Oda et al. .................................. | 379/61 |
| 4,907,291 | 3/1990 | Yamamoto ................................ | 455/78 |
| 5,678,199 | 10/1997 | Birth et al. . | |
| 5,729,572 | 3/1998 | Oh . | |
| 5,808,515 | 9/1998 | Tsuruoka et al. ........................ | 330/277 |
| 5,812,612 | 9/1998 | Saito ........................................ | 375/272 |
| 5,815,821 | 9/1998 | Pettersson ................................ | 455/575 |
| 5,986,503 | 11/1999 | Ichikawa .................................. | 330/277 |

FOREIGN PATENT DOCUMENTS

| | | |
|---|---|---|
| 62-23604 | 1/1987 | Japan . |
| 62-66705 | 3/1987 | Japan . |
| 63-149909 | 6/1988 | Japan . |
| 2-141110 | 5/1990 | Japan . |
| 3209905 | 9/1991 | Japan . |
| 4243307 | 8/1992 | Japan . |
| 5-22058 | 1/1993 | Japan . |
| 5267957 | 10/1993 | Japan . |
| 8-107316 | 4/1996 | Japan . |
| 8307305 | 11/1996 | Japan . |
| 2332797 | 6/1999 | United Kingdom . |

OTHER PUBLICATIONS

Japanese Office Action issued Mar. 1, 2000 in a related application with English translation of relevant portions.

U.K. Search/Examination Report issued Jul. 15, 1999 in a related application.

Primary Examiner—Robert Pascal
Assistant Examiner—Henry Choe
Attorney, Agent, or Firm—Ostrolenk, Faber, Gerb & Soffen, LLP

[57] ABSTRACT

A circuit for controlling a low-noise amplifier includes a low-noise transistor as an amplifying device. A bias voltage controller decreases a voltage to be applied to a gate of the transistor down to a voltage equal to or smaller than a pinch-off voltage to thereby pinch-off the low-noise amplifier, while power to be provided to the low-noise amplifier is kept off. In accordance with the circuit, even if an excessive input signal is input into the low-noise amplifier while the low-noise amplifier is not in operation, a gate current does not run through a transistor constituting the low-noise amplifier. Hence, it is possible to prevent destruction of a device and reduction in reliability of a device. In other words, the circuit operates as a circuit for protecting a device.

12 Claims, 6 Drawing Sheets

LOW-NOISE AMPLIFIER AND CIRCUIT FOR CONTROLLING THE SAME

BACKGROUND OF THE INVENTION

1. Field of the Invention

The invention relates to a low-noise amplifier, a circuit for controlling the same, and a communication terminal including the same, and more particularly to a low-noise amplifier (LNA) to be used in a receiver circuit in a mobile communication terminal and a small-sized satellite communication terminal, a circuit for controlling the same, and a communication terminal including the same.

2. Description of the Related Art

In general, a low-noise amplifier is comprised of a high electron mobility transistor (HEMT) or a metal semiconductor field effect transistor (MES FET). A low-noise amplifier is formed quite small in order to have low noise with a high frequency, in particular, a frequency in a micro-wave band. As a result, a low-noise amplifier is generally weak in response to an excessive input.

Thus, many attempts have been made to protect a low-noise amplifier from an excessive input by incorporating a protection circuit into an input section, as follows.

Japanese Unexamined Patent Publication No. 62-66705 has suggested one of such attempts.

Japanese Unexamined Patent Publication No. 63-149909 has suggested a low-noise amplifier circuit including a low-noise amplifier comprised of a field effect transistor, a level detector for detecting a level at which the low-noise amplifier receives a signal, and a gate bias controller for controlling a bias voltage to be applied to a gate of the field effect transistor in accordance with a level detected by the level detector. The gate bias controller increases a drain current in the field effect transistor in accordance with an increase in the detected level, and provides a bias voltage at an optimal point of a noise index when a low level is received, and provides a bias voltage at a maximum saturation output point when a high level is received.

Japanese Unexamined Patent Publication No. 3-209905 has suggested an amplifier including an input terminal, an input matching circuit electrically connected to the input terminal, an amplifying device electrically connected to the input matching circuit, an output matching circuit electrically connected to the amplifying device, and an output terminal electrically connected to the output matching circuit. The input matching circuit is comprised of a micro-strip line as a transmission line, and a plurality of stubs formed in a micro-strip pattern and electrically connected in parallel with the transmission line. At least one of the stubs is a capacitive stub having an about ¼ wavelength at an unnecessary signal frequency. The input matching circuit acts as a noise matching circuit for a frequency band of a signal to be amplified, and acts as a filter for attenuating a frequency of an unnecessary signal.

Japanese Unexamined Patent Publication No. 4-243307 has suggested a low-noise amplifier including a first field effect transistor for accomplishing high-frequency, low-noise amplification, a second field effect transistor for doing the same, a first ¼ wavelength micro-strip lines electrically connected between an output terminal of the first field effect transistor and a common output terminal, and a second ¼ wavelength micro-strip lines electrically connected between an output terminal of the second field effect transistor and a common output terminal.

Japanese Unexamined Patent Publication No. 5-267957 has suggested a low-noise converter including NPN bipolar transistor formed in an auto-bias circuit and having an emitter to which a current feedback resistor is electrically connected. The current feedback resistor is comprised of a temperature sensitive resistor having a negative temperature coefficient. The current feedback resistor decreases a drain current in a field effect transistor as a low-noise amplifier in accordance with reduction in a temperature. As a result, an increase in gain is prevented at low temperature, ensuring prevention of oscillation.

Japanese Unexamined Patent Publication No. 8-307305 has suggested a circuit for transmitting and receiving signals in a transceiver which circuit enhances isolation between signal receipt and signal transmission in a radio transceiver.

However, incorporation of a protection circuit into a low-noise amplifier is accompanied with a circuit loss, resulting in degradation in a noise temperature, and hence, destruction of an advantageous characteristic of a low-noise amplifier.

Even if such an attempt is made that a low-noise amplifier is less influenced in a selected frequency or in a frequency band at which a signal is received, it would be impossible to completely eliminate a circuit loss. In addition, such an attempt becomes meaningless, if an excessive input is applied to a selected frequency or a frequency band at which a signal is received.

In a mobile communication terminal, a power source for providing power to a receiver low-noise amplifier is generally turned off in order to reduce current consumption, while the receiver low-noise amplifier is not in operation, for instance, while a signal is being transmitted or while the mobile communication terminal is waiting for signals. The mobile communication terminal is weaker to an excessive input while a signal is being transmitted or while the mobile communication terminal is waiting for signals than while the mobile communication terminal is in operation.

SUMMARY OF THE INVENTION

In view of the above-mentioned problem of a conventional low-noise amplifier, it is an object of the present invention to provide a low-noise amplifier having an enhanced resistance to an excessive input at all frequencies while not in operation, without degradation in a noise temperature.

It is also an object of the present invention to provide a circuit for controlling such a low-noise amplifier.

It is further an object of the present invention to provide a communication terminal including such a low-noise amplifier.

In one aspect of the present invention, there is provided a circuit for controlling a low-noise amplifier including a low-noise transistor as an amplifying device, including a bias voltage controller for varying a bias voltage to be applied to a gate of the transistor while the low-noise amplifier is not in operation.

There is further provided a circuit for controlling a low-noise amplifier including a low-noise transistor as an amplifying device, including a bias voltage controller for decreasing a voltage to be applied to a gate of the transistor down to a voltage equal to or smaller than a pinch-off voltage to thereby pinch-off the low-noise amplifier, while power to be provided to the low-noise amplifier is kept off.

It is preferable that the bias voltage controller applies such a bias voltage to the gate of the transistor while the low-noise amplifier is in operation that the transistor is kept on, and applies such a bias voltage to the gate of the transistor while the low-noise amplifier is not in operation that the transistor is kept off.

For instance, the bias voltage controller may be comprised of first to fifth resistors, and first and second bipolar transistors, the first bipolar transistor being electrically at a base thereof to the first resistor, being electrically connected at an emitter thereof to a positive voltage source, and being electrically connected at a collector thereof to the second resistor, the emitter being electrically connected to the base through the third resistor, the second bipolar transistor being electrically connected at a base thereof to a node between the collector of the first bipolar transistor and the second resistor, being grounded at an emitter thereof, and being electrically connected at a collector thereof to a negative voltage source through the fourth and fifth resistors.

As an alternative, the bias voltage controller may be comprised of first to fourth resistors and a MOS field effect transistor, the MOS field effect transistor being electrically connected at a gate thereof to both the first resistor and a voltage source through the second resistor, being grounded at a drain thereof, and being electrically connected at a source thereof to the voltage source through the third and fourth resistors.

In another aspect of the present invention, there is provided a mobile communication terminal including (a) an antenna, (b) a first amplifier for amplifying radio signals having been received through the antenna, (c) a first circuit for processing the thus amplified radio signals, (d) a second circuit for producing radio signals to be transmitted through the antenna, (e) a second amplifier for amplifying the radio signals having been produced in the second circuit, (f) a duplexer through which radio signals are transmitted from the antenna to the first amplifier and through which radio signals are transmitted from the second amplifier to the antenna, and (g) a bias voltage controller electrically connected to both the first and second amplifiers for varying a bias voltage to be applied to a gate of a transistor of the first amplifier, while the first amplifier is not in operation.

There is further provided a mobile communication terminal including (a) an antenna, (b) a first amplifier for amplifying radio signals having been received through the antenna, (c) a first circuit for processing the thus amplified radio signals, (d) a second circuit for producing radio signals to be transmitted through the antenna, (e) a second amplifier for amplifying the radio signals having been produced in the second circuit, (f) a duplexer through which radio signals are transmitted from the antenna to the first amplifier and through which radio signals are transmitted from the second amplifier to the antenna, and (g) a bias voltage controller electrically connected to both the first and second amplifiers for decreasing a voltage to be applied to a gate of a transistor of the first amplifier down to a voltage equal to or smaller than a pinch-off voltage to thereby pinch-off the first amplifier, while power to be provided to the first amplifier is kept off.

For instance, the first amplifier may be comprised of a high electron mobility transistor (HEMT) or a metal semiconductor field effect transistor (MES FET).

In still another aspect of the present invention, there is provided a low-noise amplifier including (a) an amplifying device comprised of a low-noise transistor, and (b) a bias voltage controller for varying a bias voltage to be applied to a gate of the transistor while the amplifying device is not in operation.

It is preferable that the amplifying device is comprised of an amplifier for amplifying received radio signals in a communication terminal.

There is further provided a low-noise amplifier including (a) an amplifying device comprised of a low-noise transistor, and (b) a bias voltage controller for decreasing a voltage to be applied to a gate of the transistor down to a voltage equal to or smaller than a pinch-off voltage to thereby pinch-off the amplifying device, while power to be provided to the amplifying device is kept off.

In the present invention, the bias voltage controller varies a gate bias voltage in a field effect transistor (FET) or a high electron mobility transistor (HEMT) constituting a low-noise amplifier to be used as a receiver circuit in a mobile communication terminal, a small-sized satellite communication, and so on, when less power is supplied to the low-noise amplifier while a communication terminal including the low-noise amplifier is in a condition for waiting for radio signals. The bias voltage controller enhances a resistance to an excessive input while the communication terminal is transmitting radio signals or is waiting for radio signals transmitted from other communication terminals, ensuring prevention of degradation and destruction of a device including the low-noise amplifier.

A conventional mobile communication terminal is designed to stop power supply to a low-noise amplifier while a radio signal is being transmitted or the terminal stands by for receiving radio signals, in order to reduce current consumption. On the other hand, in accordance with the present invention, a voltage to be applied to a gate of an amplifying device such as HEMT or MES FET is reduced down to a voltage equal to or smaller than a pinch-off voltage or a cut-off voltage to thereby pinch-off or cut-off the amplifying device, while the power supply to a low-noise amplifier is being stopped. As a result, a drain current is prevented from running through the amplifying device, and hence, current consumption becomes zero.

In addition, since a gate voltage is biased to be negative, a forward current does not run between a gate and a source in a transistor constituting the amplifying device, even if an excessive input signal is input into the amplifying device.

For the above-mentioned reasons, the present invention makes it possible to enhance a resistance to an excessive input during signal transmission and stand-by for radio signals, and reduce the possibility of degradation and destruction of a device including the amplifying device.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
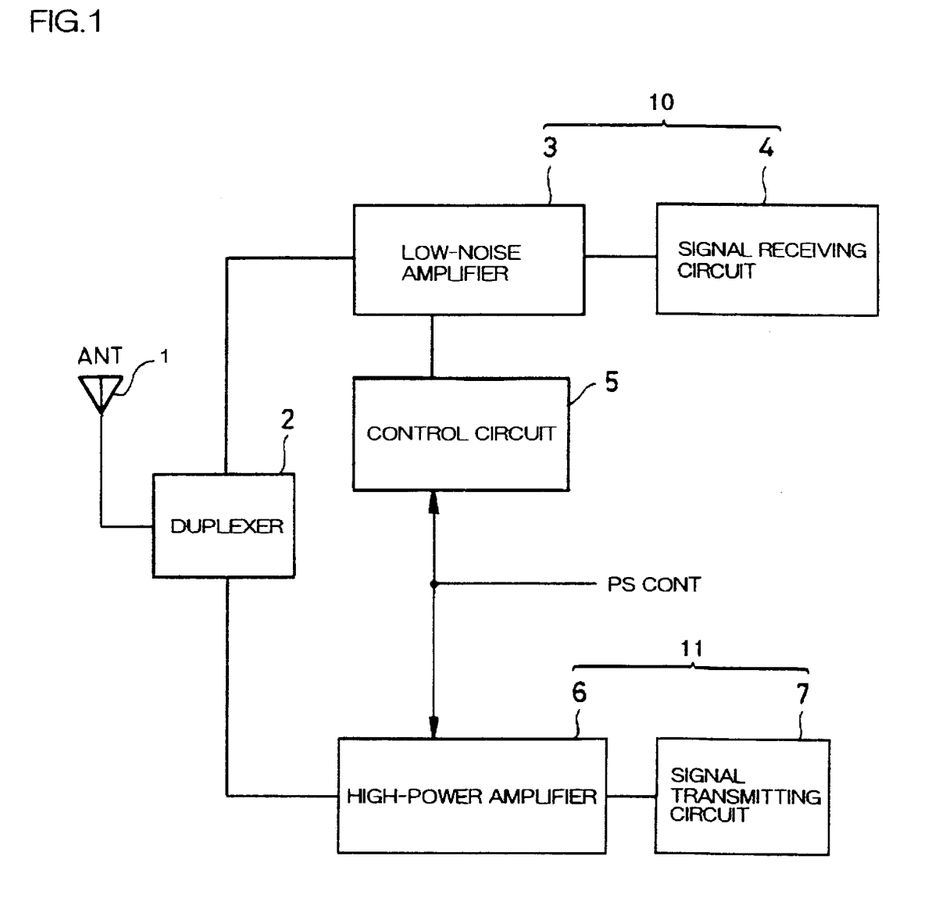
FIG. 1 is a block diagram of a mobile communication terminal in accordance with an embodiment of the present invention.

FIG. 1 is a block diagram of a mobile communication terminal in accordance with a preferred embodiment of the present invention.

The illustrated mobile communication terminal is comprised of an antenna 1, a signal receiving system 10, a signal transmitting system 11, a duplexer 2, and a control circuit 5.

The duplexer 2 is used for both the signal receiving system and the signal transmitting system 11. Specifically, radio signals are transmitted from the signal transmitting system 11 to the antenna 1 through the duplexer 2, and radio signals having been received by the antenna 1 are transmitted to the signal receiving system 10 through the duplexer 2.

The signal receiving system 10 is comprised of a low-noise amplifier 3 and a signal receiving circuit 4. For instance, the signal receiving circuit 4 is comprised of a signal-receiving converter and a demodulator.

The signal transmitting system 11 is comprised of a high-power amplifier 6 and a signal transmitting circuit 7. For instance, the signal transmitting circuit 7 is comprised of a signal-transmitting converter and a modulator.

The control circuit 5 is electrically connected to both the low-noise amplifier 3 and the high-power amplifier 6. The control circuit 5 varies a bias voltage to be applied to a gate of a transistor constituting the low-noise amplifier 3, while the low-noise amplifier 3 is not in operation, to thereby control a power source which supplies power to both the high-power amplifier 6 and the low-noise amplifier 3.

Figure 2:
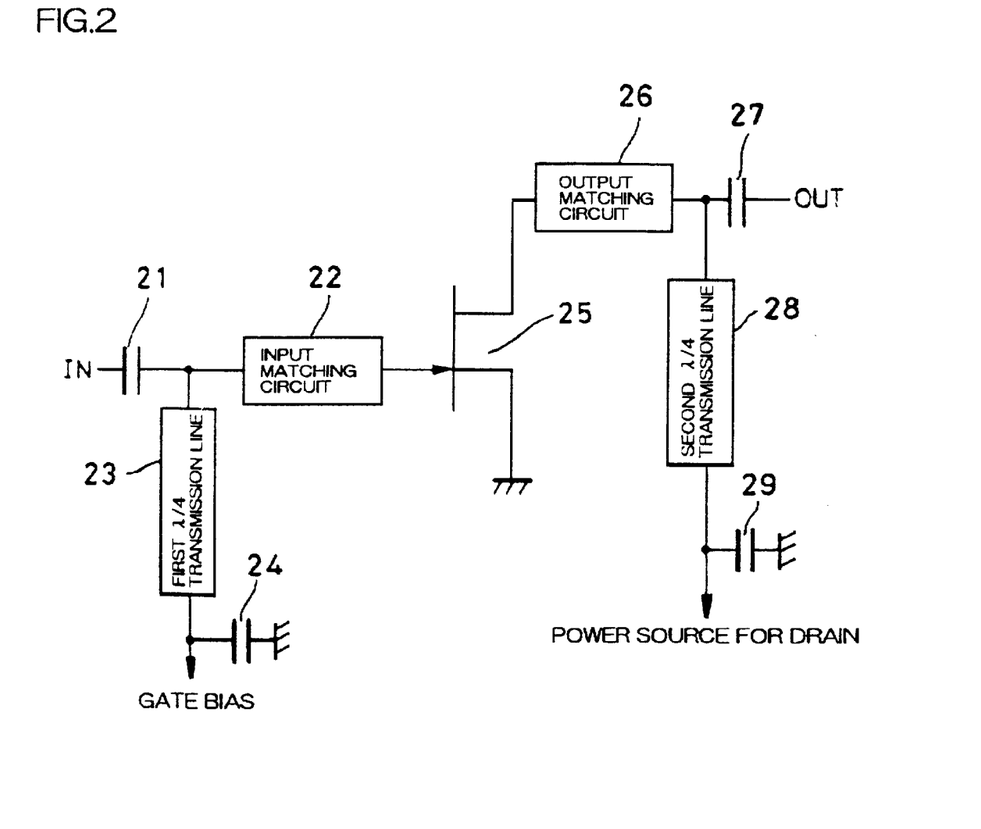
FIG. 2 is a circuit diagram of an example of a low-noise amplifier.

FIG. 2 is a circuit diagram of the low-noise amplifier 3 illustrated in FIG. 1. The low-noise amplifier 3 is comprised of a first capacitor 21 for cutting dc current, a first matching strip line or input matching circuit 22 electrically connected to the first capacitor 21, a high electron mobility transistor 25 (hereinafter, referred to simply as "HEMT"), a second matching strip line or output matching circuit 26, a second capacitor 27 electrically connected to the output matching circuit 26 for cutting dc current, a first λ/4 transmission line 23 electrically connected to a node located between the first capacitor 21 and the input matching circuit 22, a first bypass capacitor 24 electrically connected at one end to an output terminal of the first λ/4 transmission line 23, and further grounded at the other end, a second λ/4 transmission line 28 electrically connected to a node located between the output matching circuit 26 and the second capacitor 27, a second bypass capacitor 29 electrically connected at one end to an output terminal of the second λ/4 transmission line 28, and further grounded at the other end.

HEMT device 25 is an amplifying device, and has a gate electrically connected to the input matching circuit 22, a grounded source, and a drain electrically connected to the output matching circuit 26.

In operation, an input signal is introduced into the gate of HEMT device 25 through the first capacitor 21 and the input matching circuit 22. An output signal is transmitted from HEMT device 25 through the output matching circuit 26 and the second capacitor 27.

A bias is applied to a gate of HEMT device 25 through the first λ/4 transmission line 23. Power is supplied to a drain of HEMT device 25 through the second λ/4 transmission line 28.

Figure 3:
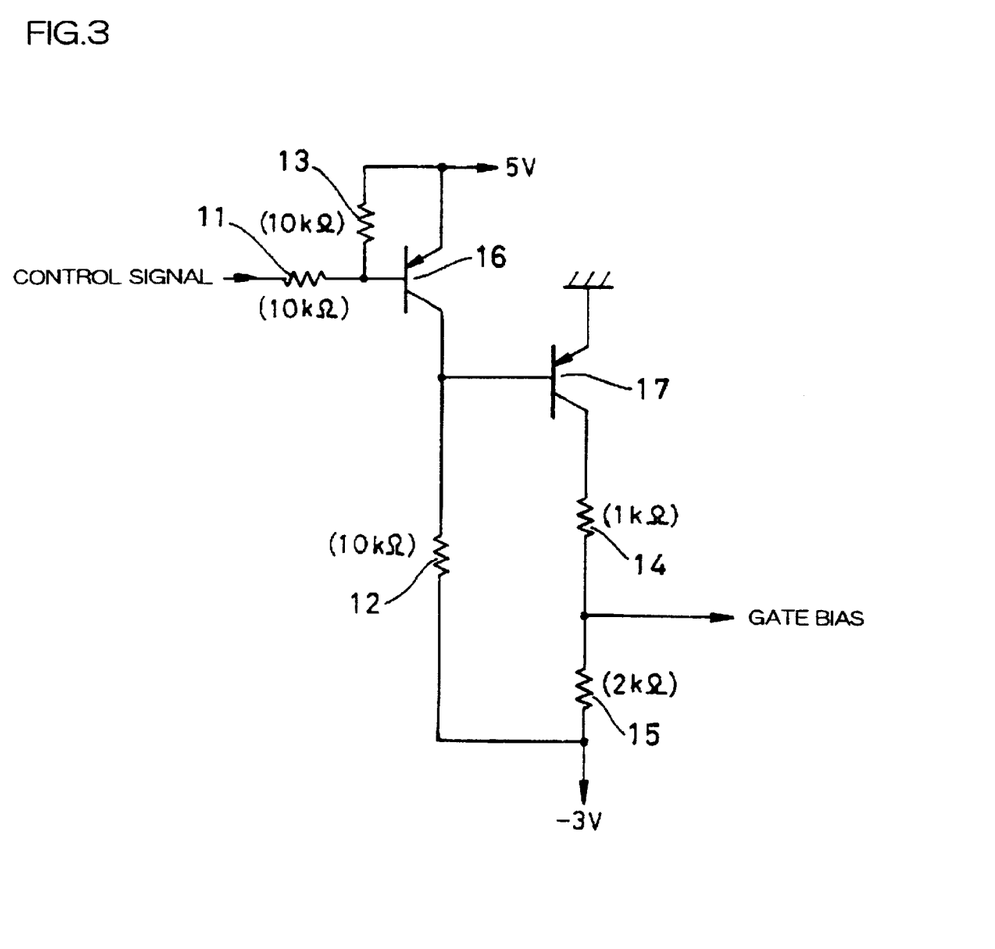
FIG. 3 is a circuit diagram of a control circuit constituting the mobile communication terminal illustrated in FIG. 1.

FIG. 3 is a circuit diagram of the control circuit 5. The control circuit 5 controls a power source, and supplies a bias voltage in the low-noise amplifier illustrated in FIG. 2. The control circuit 5 is comprised of first to fifth resistors 11 to 15, and first and bipolar second transistors 16 and 17.

The first bipolar transistor 16 is electrically connected at a base thereof to the first resistor 11, electrically connected at an emitter thereof to a positive 5V source, and electrically connected at a collector thereof to the second resistor 12. The emitter is electrically connected to the base through the third resistor 13. The second resistor 12 is also electrically connected to a negative −3V source. A signal for controlling a power source is introduced into the control circuit 5 through the first resistor 11.

The second bipolar transistor 17 is electrically connected at a base thereof to a node located between the collector of the first bipolar transistor 16 and the second resistor 12, grounded at an emitter thereof, and electrically connected at a collector thereof to the negative −3V source through the fourth and fifth resistors 14 and 15. A gate bias is supplied to HEMT device 25 from a node located between the fourth and fifth resistors 14 and 15.

Hereinbelow is explained an operation of the mobile communication terminal illustrated in FIG. 1.

While an input radio signal is being received, the low-noise amplifier 3 is kept on, namely, kept in operation, whereas the high-power amplifier 6 is kept off, namely, kept in non-operation. Contrary, while a signal is being transmitted, the low-noise amplifier 3 is kept off, whereas the high-power amplifier 6 is kept on. While the mobile communication terminal is in stand-by condition for receiving radio signals, the low-noise amplifier 3 and the high-power amplifier 6 are kept off in order to save current consumption.

When a radio signal is received, the received signal is transmitted from the antenna 1 to the low-noise amplifier 3 through the duplexer 2, and amplified in the low-noise amplifier 3. The thus amplified signal is transmitted to the signal receiving circuit 4. When a radio signal is transmitted, a signal produced in the signal transmitting circuit 7 is amplified in the high-power amplifier 6, and the thus amplified signal is output through the duplexer 2 and then the antenna 1.

When the mobile communication terminal is in stand-by condition, neither signal transmission mode nor signal receipt mode are carried out. However, the mobile communication terminal is transferred to the signal receipt mode at a predetermined interval. Signals having been received through the antenna 1 are input into the low-noise amplifier 3 through the duplexer 2, regardless of whether the low-noise amplifier 3 is on or off.

With reference to FIG. 2, a signal input into the low-noise amplifier 3 is converted into an impedance, namely, noise-matched in the first matching circuit 22 in such a manner that noise is minimized. The thus noise-matched signal is then introduced into HEMT device 25. The first λ/4 transmission line 23 and the first bypass capacitor 24 cooperate with each other to provide a bias to HEMT device 25 so that the matching operation of the first matching circuit 22 is not influenced by the bias. A signal having been amplified in HEMT device 25 is matched in the second matching circuit 26, and then, is output through the second capacitor 27. The second λ/4 transmission line 28 and the second bypass capacitor 29 cooperate with each other to supply power to a drain of HEMT device 25.

With reference to FIG. 3, a signal for controlling the low-noise amplifier 3 to be turned on or off is input into the first resistor 11. This control signal consists of a logic signal, and is designed to have a high level when the low-noise amplifier 3 is to be turned on, and have a low level when the low-noise amplifier 3 is to be turned off. In this embodiment, the high level is set equal to +5V, and the low level is set equal to 0V.

When the control signal is in the high level, a base current does not run through the first bipolar transistor 16, resulting in that the first bipolar transistor 16 is turned off. On the other hand, the second bipolar transistor 17 is turned on, because a base current runs through the second bipolar transistor 17 by virtue of the second resistor 12. As a result, a current runs through the fourth and fifth resistors 14 and 15 electrically connected in series to a collector of the second bipolar transistor 17. An output voltage is divided by the fourth and fifth resistors 14 and 15 into about −1V. Thus, a voltage of about −1V is applied to the low-noise amplifier 3.

The thus produced voltage of about −1V acts as a gate bias voltage applied to HEMT device 25 while the low-noise amplifier 3 is in operation. When the control signal is in the low level, a base current runs through the first resistor 11 into the first bipolar transistor 16, and hence, the first bipolar transistor 16 is turned on. On the other hand, a base current does not run through the second bipolar transistor 17 so the second bipolar transistor 17 is turned off. Hence, a voltage of −3V is output through the fifth resistor 15 as a gate bias voltage. As having been explained with reference to FIG. 2, the gate bias voltages transmitted from the control circuit 5 is input into the low-noise amplifier 3 as a gate bias input.

As having been explained so far, the control circuit 5 switches a gate bias voltage between −3V and −1V in accordance with the logic signal.

Figure 4:
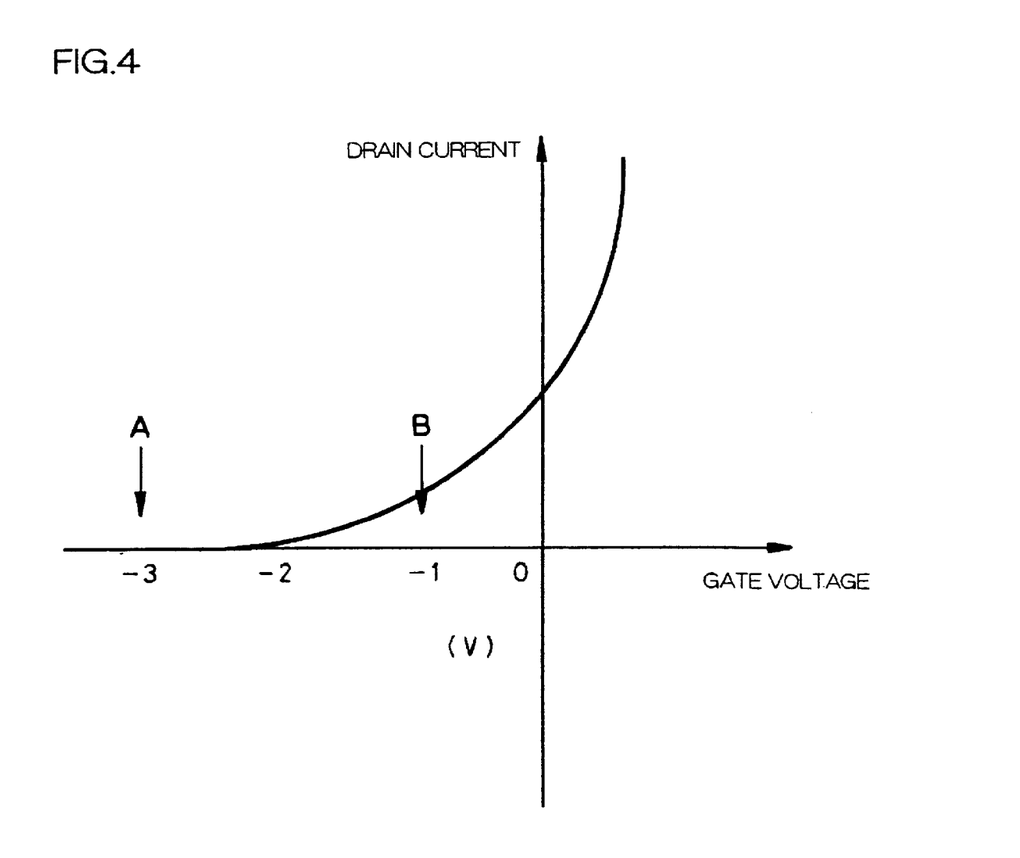
FIG. 4 is a graph showing a relation between a gate voltage and a drain current in a HEMT device.

FIG. 4 illustrates a relation between a gate voltage and a drain current in HEMT device 25. When a gate voltage is set equal to −1V, as indicated with an arrow B, an appropriate drain current runs through HEMT device 25, and hence, HEMT device 25 is kept on. That is, the low-noise amplifier 3 is in normal operation. On the other hand, when a gate voltage is set equal to −3V, as indicated with an arrow A, HEMT device 25 is pinched-off, and hence, a drain current does not run through HEMT device 25. Accordingly, it is possible to reduce current consumption of the low-noise amplifier 3 down to zero.

Figure 5:
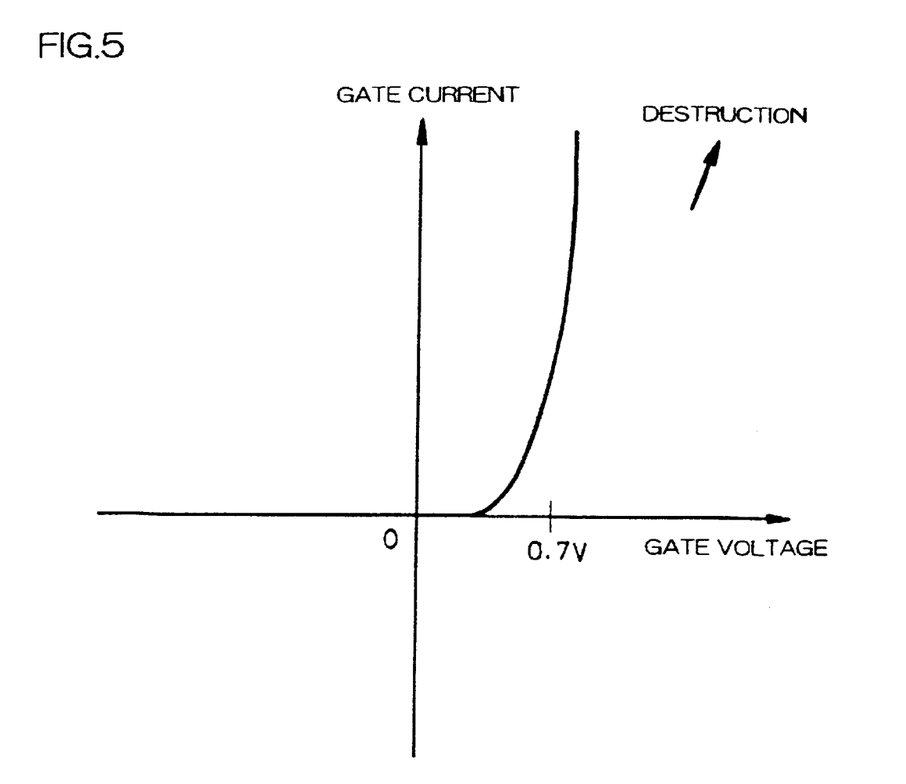
FIG. 5 is a graph showing a relation between a gate current and a gate voltage in a HEMT device.

FIG. 5 illustrates a relation between a gate current and a gate voltage in HEMT device 25 constituting a part of the low-noise amplifier 3. In a HEMT device and a MES FET device, since a gate and a source are electrically connected to each other in schottky junction, a gate current runs through the device, if a forward voltage is applied to the device. As illustrated in FIG. 5, the gate current exponentially increases in line with the gate voltage. In particular, the gate current significantly increases, if the gate voltage is in excess of 0.7V. Since a low-noise device including HEMT device 25 is generally formed quite small, the exponentially increasing gate current would bring HEMT device 25 into destruction. Accordingly, it is necessary to control a voltage to be applied to a gate of HEMT device 25 in such a manner that the voltage is not in excess of 0V.

Figure 6:
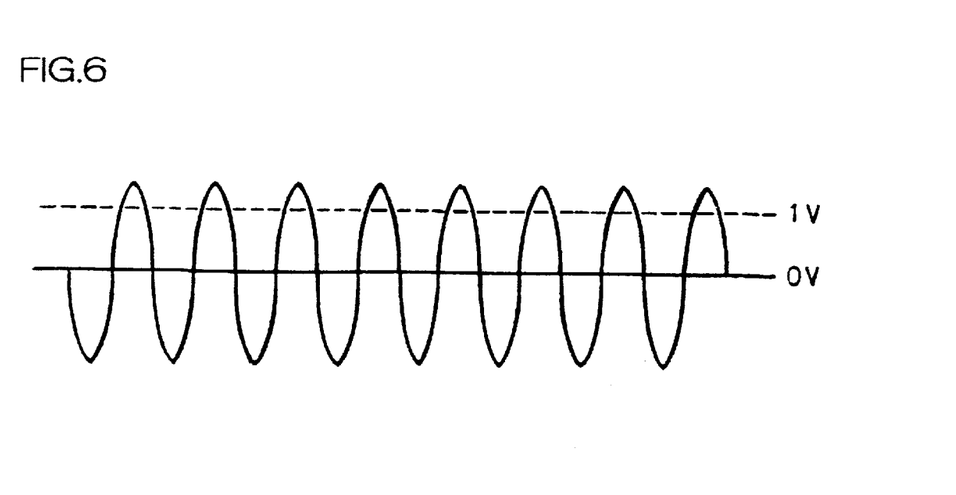
FIG. 6 illustrates a waveform of a signal to be applied to a gate of a transistor constituting a conventional low-noise amplifier, when an excessive input signal is input into the transistor while power supply to the low-noise amplifier is off.

FIG. 6 illustrates a waveform of a voltage to be applied to a gate when an excessive input signal is input into a conventional low-noise amplifier while a power supply is off. As illustrated in FIG. 6, a peak value of the gate voltage is over 1V, and hence, a gate current is produced in HEMT device with the result of the possibility of the destruction of HEMT device.

Figure 7:
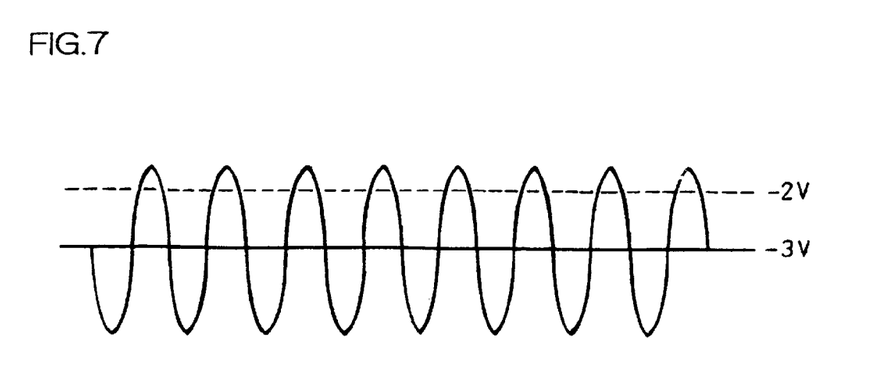
FIG. 7 illustrates a waveform of a signal to be applied to a gate of a transistor constituting a low-noise amplifier in accordance with the present invention, when an excessive input signal is input into the transistor while power supply to the low-noise amplifier is off.

FIG. 7 illustrates a waveform of a voltage to be applied to a gate when an excessive input signal is input into the low-noise amplifier in the embodiment while a power supply is off. Since the gate voltage wave is around a voltage of −3V, even a peak voltage is below 0V. This means that a gate current is not produced in HEMT device 25, ensuring protection of HEMT device 25 from destruction.

In the low-noise amplifier 3 illustrated in FIG. 3, HEMT device 25 may be replaced with MES FET. A low-noise amplifier including MES FET could provide the same advantages as those of the low-noise amplifier 3 including HEMT device 25.

In the above-mentioned embodiment, the gate bias voltage was set equal to −1V. However, it should be noted that a gate bias voltage appropriate to each device can be determined by selecting resistance values of the fourth and fifth resistors 14 and 15.

Figure 8:
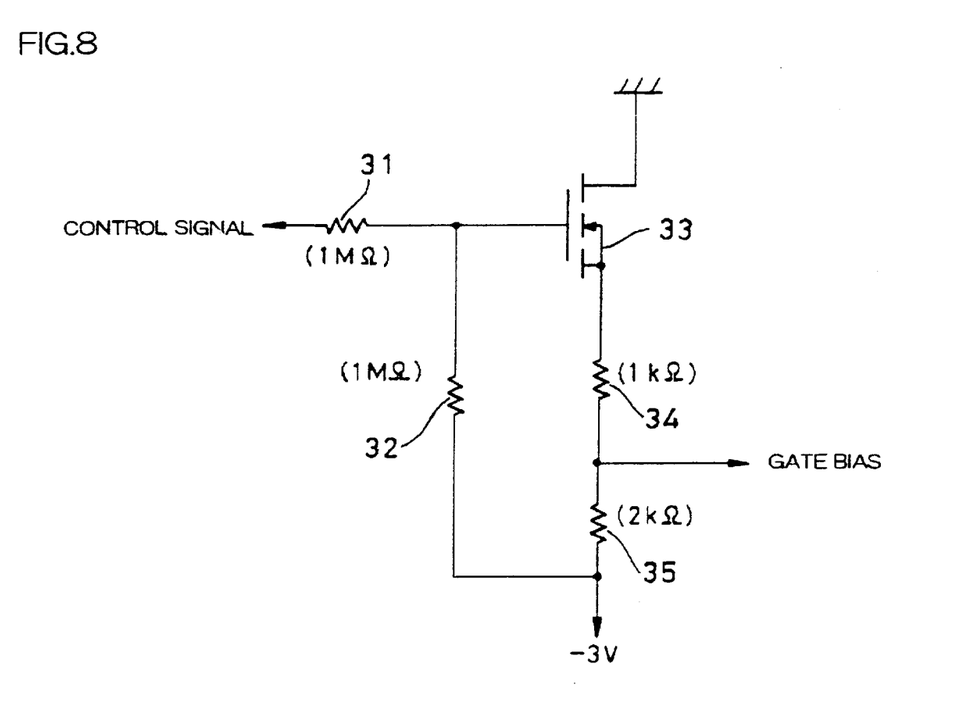
FIG. 8 is a circuit diagram of another control circuit constituting the mobile communication terminal illustrated in FIG. 1.

FIG. 8 is a circuit diagram of another example of the control circuit 5. The illustrated control circuit 5 includes MOS FET in place of a bipolar transistor.

Specifically, the control circuit 5 illustrated in FIG. 8 is comprised of first to fourth resistors 31, 32, 34, 35, and MOS FET 33. MOS FET 33 is electrically connected at a gate thereof to both the first resistor 31 and a voltage source (−3V) through the second resistor 32, grounded at a drain thereof, and electrically connected at a source thereof to the voltage source through the third and fourth resistors 34 and 35.

A control signal for controlling the low-noise amplifier 3 to be turned on or off is input into the first resistor 31. This control signal consists of a logic signal, and is designed to have a high level when the low-noise amplifier 3 is to be turned on, and have a low level when the low-noise amplifier 3 is to be turned off. The high level is set equal to +5V, and the low level is set equal to 0V.

When the control signal is in high level, a positive voltage is applied to MOS FET 33 as a gate voltage, resulting in that MOS FET 33 is turned on. Thus, a voltage is generated across the third and fourth resistors 34 and 35 both electrically connected to a source of MOS FET 33. This voltage is divided by the fourth and fifth resistors 34 and 35, and as a result, an output voltage of about −1V is applied to the low-noise amplifier 3 as a gate bias voltage.

The thus produced output voltage of about −1V acts as a gate bias voltage applied to HEMT device 25 while the low-noise amplifier 3 is in operation. When the control signal is in the low level, a negative voltage is applied to MOS FET 33 as a gate voltage through the second resistor 32, resulting in that MOS FET 33 is turned off. As a result, there is produced an output voltage of −3V as a gate bias voltage through the fourth resistor 35. As having been explained with reference to FIG. 2, the gate bias voltage transmitted from the control circuit 5 is input into the low-noise amplifier 3 as a gate bias input.

The control circuit 5 illustrated in FIG. 8 switches a gate bias voltage between −3V and −1V in accordance with the logic signal, similar to the control circuit 5 illustrated in FIG. 3. The control circuit 5 including MOS FET 33, illustrated in FIG. 8, has an advantage over the control circuit including the bipolar transistors 16 and 17, illustrated in FIG. 3, in that a current is hardly consumed.

In accordance with the present invention, even if an excessive input signal is input into a low-noise amplifier while the low-noise amplifier is not in operation, a gate current is not produced. Hence, it is possible to prevent destruction of a device including the low-noise amplifier and to prevent reduction in reliability of a device. In other words, the low-noise amplifier acts as a circuit for protecting a device including the low-noise amplifier therein.

In a communication terminal in which an output transmitted from a power amplifier for a signal transmitting system is supplied also to a signal receiving system, the low-noise amplifier acts as a protection circuit while a signal is being transmitted, namely, while the low-noise amplifier is not in operation. Since it is not necessary to modify a low-noise amplifier, it would be possible to enhance performances of a low-noise amplifier without degradation of a noise temperature.

In addition, the low-noise amplifier in accordance with the present invention can act as a protection circuit for excessive input signals having all frequencies. Hence, it would be possible to control a power supply in a simple structure, and reduce current consumption to zero with a power supply being kept electrically connected to a drain of an amplifying device of the low-noise amplifier.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-67535 filed on Mar 18, 1998 including specification, claims, drawings and summary is incorporated herein by reference in its entirety.

What is claimed is:

1. A circuit for controlling a low-noise amplifier including a low-noise transistor as an amplifying device, said circuit comprising:
   a bias voltage controller which varies a bias voltage to be applied to a gate of said transistor while said low-noise amplifier is not in operation; wherein:
   said bias voltage controller is comprised of first to fifth resistors, and first and second bipolar transistors;
   said first bipolar transistor being electrically connected at a base thereof to said first resistor, being electrically connected at an emitter thereof to a positive voltage source, and being electrically connected at a collector thereof to said second resistor, said emitter being electrically connected to said base through said third resistor;
   said second bipolar transistor being electrically connected at a base thereof to a node between said collector of said first bipolar transistor and said second resistor, said second bipolar transistor being grounded at an emitter thereof, and being electrically connected at a collector thereof to a negative voltage source through said fourth and fifth resistors.

2. A circuit for controlling a low-noise amplifier including a low-noise transistor as an amplifying device, said circuit comprising:
   a bias voltage controller which varies a bias voltage to be applied to a gate of said transistor while said low-noise amplifier is not in operation; wherein:
   said bias voltage controller is comprised of first to fourth resistors and a MOS field effect transistor;
   said MOS field effect transistor being electrically connected at a gate thereof to said first resistor and to a voltage source through said second resistor, said MOS field effect transistor being grounded at a drain thereof, and being electrically connected at a source thereof to said voltage source through said third and fourth resistors.

3. A circuit for controlling a low-noise amplifier including a low-noise transistor as an amplifying device, said circuit comprising:
   a bias voltage controller which decreases a voltage to be applied to a gate of said transistor down to a voltage equal to or smaller than a pinch-off voltage to thereby pinch-off said low-noise amplifier, power provided to said low-noise amplifier is kept off; wherein:
   said bias voltage controller is comprised of first to fifth resistors, and first and second bipolar transistors;
   said first bipolar transistor being electrically connected at a base thereof to said first resistor, being electrically connected at an emitter thereof to a positive voltage source, and being electrically connected at a collector thereof to said second resistor, said emitter being electrically connected to said base through said third resistor;
   said second bipolar transistor being electrically connected at base thereof to a node between said collector of said first bipolar transistor and said second resistor, said second bipolar transistor being grounded at an emitter thereof, and being electrically connected at a collector thereof to a negative voltage source through said fourth and fifth resistors.

4. A circuit for controlling a low-noise amplifier including a low-noise transistor as an amplifying device, said circuit comprising:
   a bias voltage controller which decreases a voltage to be applied to a gate of said transistor down to a voltage equal to or smaller than a pinch-off voltage to thereby pinch-off said low-noise amplifier, when power provided to said low-noise amplifier is kept off; wherein:
   said bias voltage controller is comprised of first to fourth resistors and a MOS field effect transistor;
   said MOS field effect transistor being electrically connected at a gate thereof to both said first resistor and to a voltage source through said second resistor, said MOS field effect transistor being grounded at a drain thereof, and being electrically connected at a source thereof to said voltage source through said third and fourth resistors.

5. A mobile communication terminal comprising:
   an antenna which receives radio signals;
   a first amplifier which amplifies said radio signals thereby producing amplified radio signals;
   a first circuit which processes said amplified radio signals;
   a second circuit which produces other radio signals to be transmitted through said antenna;
   a second amplifier which amplifies said other radio signals;
   a duplexer which transmits said radio signals from said antenna to said first amplifier and which transmits said other radio signals from said second amplifier to said antenna; and
   a bias voltage controller electrically connected to both said first and second amplifiers, said bias voltage controller varies a bias voltage to be applied to a gate of a transistor of said first amplifier, when said first amplifier is not in operation;
   wherein:

said bias voltage controller is comprised of first to fifth resistors, and first and second bipolar transistors;

said first bipolar transistor being electrically connected at a base thereof to said first resistor, being electrically connected at an emitter thereof to a positive voltage source, and being electrically connected at a collector thereof to said second resistor, said emitter being electrically connected to said base through said third resistor;

said second bipolar transistor being electrically connected at a base thereof to a node between said collector of said first bipolar transistor and said second resistor, said second bipolar transistor being grounded at an emitter thereof, and being electrically connected at a collector thereof to a negative voltage source through said fourth and fifth resistors.

6. A mobile communication terminal comprising:

an antenna which receives radio signals;

a first amplifier which amplifies said radio signals thereby producing amplified radio signals;

a first circuit which processes said amplified radio signals;

a second circuit which produces other radio signals to be transmitted through said antenna;

a second amplifier which amplifies said other radio signals;

a duplexer which transmits said radio signals from said antenna to said first amplifier and which transmits said other radio signals from said second amplifier to said antenna; and a bias voltage controller electrically connected to both said first and second amplifiers, said bias voltage controller varies a bias voltage to be applied to a gate of a transistor of said first amplifier, when said first amplifier is not in operation;

wherein:
said bias voltage controller is comprised of first to fourth resistors and a MOS field effect transistor;
said MOS field effect transistor being electrically connected at a gate thereof to said first resistor and to a voltage source through said second resistor, said MOS field effect transistor being grounded at a drain thereof, and being electrically connected at a source thereof to said voltage source through said third and fourth resistors.

7. A mobile communication terminal comprising:

an antenna which receives radio signals;

a first amplifier which amplifies said radio signals to produce amplified radio signals;

a first circuit which processes said amplified radio signals;

a second circuit which produces other radio signals to be transmitted through said antenna;

a second amplifier which amplifiers said other radio signals;

a duplexer which transmits said radio signals from said antenna to said first amplifier and which transmits said other radio signals from said second amplifier to said antenna; and a bias voltage controller electrically connected to both said first and second amplifiers, said bias voltage controller decreases a voltage to be applied to a sate of a transistor of said first amplifier down to a voltage equal to or smaller than a pinch-off voltage to thereby pinch-off said first amplifier, when power provided to said first amplifier is kept off;

wherein said bias voltage controller is comprised of first to fifth resistors, and first and second bipolar transistors;

said first bipolar transistor being electrically connected at a base thereof to said first resistor, being electrically connected at an emitter thereof to a positive voltage source, and being electrically connected at a collector thereof to said second resistor, said emitter being electrically connected to said base through said third resistor;

said second bipolar transistor being electrically connected at a base thereof to a node between said collector of said first bipolar transistor and said second resistor, said second bipolar transistor being grounded at an emitter thereof, and being electrically connected at a collector thereof to a negative voltage source through said fourth and fifth resistors.

8. A mobile communication terminal comprising:

an antenna which receives radio signals;

a first amplifier which amplifies said radio signals to produce amplified radio signals;

a first circuit which processes said amplified radio signals;

a second circuit which produces other radio signals to be transmitted through said antenna;

a second amplifier which amplifiers said other radio signals;

a duplexer which transmits said radio signals from said antenna to said first amplifier and which transmits said other radio signals from said second amplifier to said antenna; and a bias voltage controller electrically connected to both said first and second amplifiers, said bias voltage controller decreases a voltage to be applied to a gate of a transistor of said first amplifier down to a voltage equal to or smaller than a pinch-off voltage to thereby pinch-off said first amplifier, when power provided to said first amplifier is kept off;

wherein said bias voltage controller is comprised of first to fourth resistors and a MOS field effect transistor;

said MOS field effect transistor being electrically connected at a gate thereof to said first resistor and to a voltage source through said second resistor, said MOS field effect transistor being grounded at a drain thereof, and being electrically connected at a source thereof to said voltage source through said third and fourth resistors.

9. A low-noise amplifier comprising:

an amplifying device comprised of a low-noise transistor; and a bias voltage controller which varies a bias voltage to be applied to a gate of said transistor while said amplifying device is not in operation; wherein:

said bias voltage controller is comprised of first to fifth resistors, and first and second bipolar transistors;

said first bipolar transistor being electrically connected at a base thereof to said first resistor, being electrically connected at an emitter thereof to a positive voltage source, and being electrically connected at a collector thereof to said second resistor, said emitter being electrically connected to said base through said third resistor;

said second bipolar transistor being electrically connected at a base thereof to a node between said collector of said first bipolar transistor and said second resistor, said second bipolar transistor being grounded at an emitter thereof, and being electrically connected at a collector thereof to a negative voltage source through said fourth and fifth resistors.

10. A low-noise amplifier comprising:

an amplifying device comprised of a low-noise transistor; and a bias voltage controller which varies a bias voltage to be applied to a gate of said transistor while said amplifying device is not in operation; wherein:
   said bias voltage controller is comprised of first to fourth resistors and a MOS field effect transistor;
   said MOS field transistor being electrically connected at a gate thereof to said first resistor and to a voltage source through said second resistor, said MOS field effect transistor being grounded at a drain thereof, and being electrically connected at a source thereof to said voltage source through said third and fourth resistors.

11. A low-noise amplifier comprising:

an amplifying device comprised of a low-noise transistor; and a bias voltage controller which decreases a voltage to be applied to a gate of said transistor down to a voltage equal to or smaller than a pinch-off voltage to thereby pinch-off said amplifying device, when power provided to said amplifying device is kept off;

wherein:
   said bias voltage controller is comprised of first to fifth resistors, and first and second bipolar transistors;
   said first bipolar transistor being electrically connected at a base thereof to said first resistor, being electrically connected at an emitter thereof to a positive voltage source, and being electrically connected at a collector thereof to said second resistor, said emitter being electrically connected to said base through said third resistor;
   said second bipolar transistor being electrically connected at a base thereof to a node between said collector of said first bipolar transistor and said second resistor, said second bipolar transistor being grounded at an emitter thereof, and being electrically connected at a collector thereof to a negative voltage source through said fourth and fifth resistors.

12. A low-noise amplifier comprising:

an amplifying device comprised of a low-noise transistor; and a bias voltage controller which decreases a voltage to be applied to a gate of said transistor down to a voltage equal to or smaller than a pinch-off voltage to thereby pinch-off said amplifying device, when power provided to said amplifying device is kept off;

wherein;
   said bias voltage controller is comprised of first to fourth resistors and a MOS field effect transistor;
   said MOS field effect transistor being electrically connected at a gate thereof to said first resistor and to a voltage source through said second resistor, said MOS field effect transistor being grounded at a drain thereof, and being electrically connected at a source thereof to said voltage source through said third and fourth resistors.

* * * * *